(12) United States Patent
Chatterjee et al.

(10) Patent No.: US 6,180,978 B1
(45) Date of Patent: Jan. 30, 2001

(54) DISPOSABLE GATE/REPLACEMENT GATE MOSFETS FOR SUB-0.1 MICRON GATE LENGTH AND ULTRA-SHALLOW JUNCTIONS

(75) Inventors: Amitava Chatterjee, Plano; Richard A. Chapman; Syed Suhail Murtaza, both of Dallas, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/216,216

(22) Filed: Dec. 18, 1998

Related U.S. Application Data
(60) Provisional application No. 60/070,059, filed on Dec. 30, 1997.

(51) Int. Cl.[7] ................................................. H01L 29/94
(52) U.S. Cl. ............................................ 257/327; 257/346
(58) Field of Search ........................... 257/344, 345, 257/346, 327, 335–338

(56) References Cited

U.S. PATENT DOCUMENTS

| | | | |
|---|---|---|---|
| 4,419,810 | * 12/1983 | Riseman | 257/346 |
| 4,892,837 | * 1/1990 | Kudo | 257/370 |
| 5,376,578 | 12/1994 | Hsu et al. | 437/56 |
| 5,498,567 | * 3/1996 | Klose et al. | 438/151 |
| 5,545,578 | * 8/1996 | Park et al. | 437/44 |
| 5,567,966 | 10/1996 | Hwang | 257/347 |
| 5,589,410 | 12/1996 | Sato et al. | 437/40 |
| 5,963,791 | * 10/1999 | Brown et al. | 438/105 |
| 6,025,235 | * 2/2000 | Krivokapic | 257/335 |

FOREIGN PATENT DOCUMENTS

0480446 A2  4/1992 (EP).
06084939  3/1994 (JP).

OTHER PUBLICATIONS

Mimura, et al., "New Structure of Enhancement–Mode GaAs Microwave M.O.S.F.E.T.", Electronics Letters, Aug. 3, 1987, UK, vol. 14, No. 16, pp. 500–502 XP–002118596.

1997 IEEE "Sub–100nm Gate Length Metal Gate NMOS Transistors Fabricated by a Replacement Gate Process", pp. IEDM 97–821 thru IEDM 97–824 (A. Chatterjee, R.A. Chapman, G. Dixit, J. Kuehne, S. Hattangady, H. Yang, G.A. Brown, R. Aggarwal, U. Erdogan, Q.He, M. Hanratty, D. Rogers, S. Murtaza, S.J. Fang, R. Kraft, A.L.P. Rotondaro, J.C. Hu, M. Terry, W. Lee, C. Fernando, A. Konecni, G. Wells, D. Frystak, C. Bowen, M. Rodder, and I.–C. Chen).

T. Ohguro et al., "Tenth micron p–MOSFET's with ultra–thin epitaxial channel layer grown by ultra–high vacuum CVD" IEDM 93 (1993) pp. 433–436.*

\* cited by examiner

Primary Examiner—J. Carroll
(74) Attorney, Agent, or Firm—Peter K. McLarty; Jacqueline J. Garner; Fred J. Telecky, Jr.

(57) ABSTRACT

A counter-doped epitaxial silicon (doped opposite to the substrate type) is used to form the buried layer in a CMOS transistor, while maintaining an abrupt channel profile. Shallow source/drain junctions with abrupt source/drain profiles may be formed using raised (or elevated) source/drain design. The invention encompasses a transistor structure including a doped silicon substrate, and an oppositely-doped epitaxial silicon layer formed on the substrate. A gate is formed on the epitaxial layer, the gate defining a channel region in the epitaxial layer underneath the gate. A layer is formed on the epitaxial silicon layer on opposing sides of, and is electrically isolated from, the gate.

8 Claims, 7 Drawing Sheets

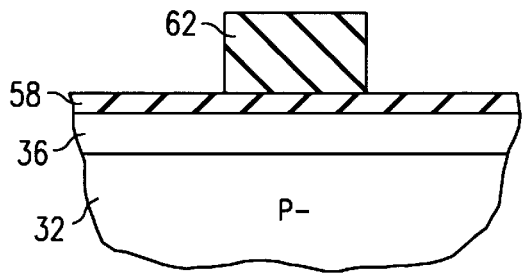
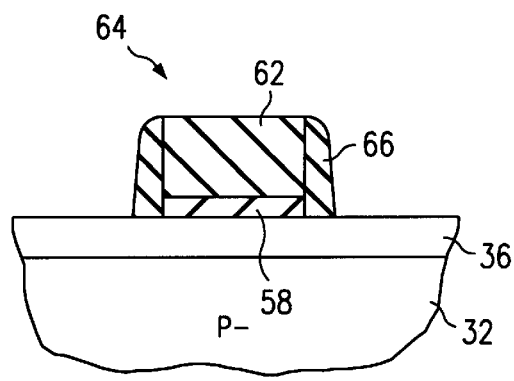
FIG. 5A          FIG. 5B
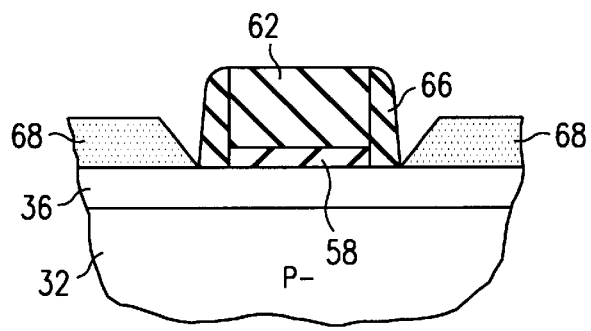
FIG. 5C
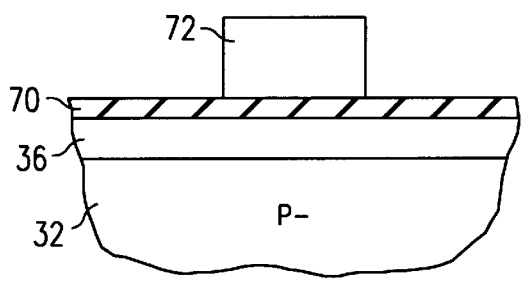
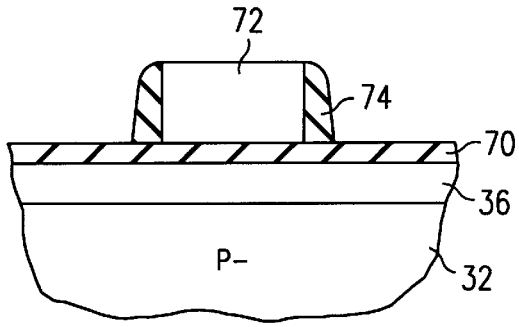
FIG. 6A          FIG. 6B
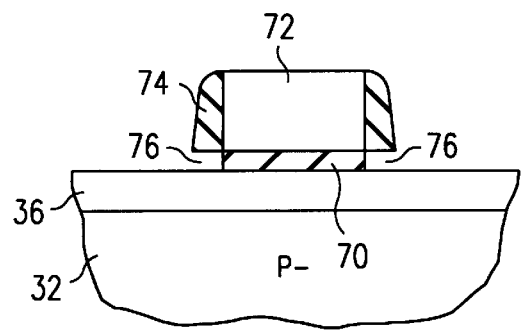
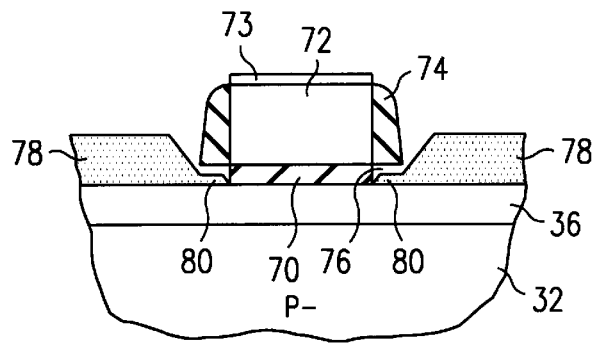
FIG. 6C          FIG. 6D

DISPOSABLE GATE/REPLACEMENT GATE MOSFETS FOR SUB-0.1 MICRON GATE LENGTH AND ULTRA-SHALLOW JUNCTIONS

This application claims priority under 35 USC §119 (e) (1) of provision application number 60/070,059, filed Dec. 30, 1997.

FIELD OF THE INVENTION

This invention relates to improvements in semiconductor processing techniques, and more particularly to improved semiconductor structures and associated methods for making semiconductor structures, or the like, and still more particularly to improvements in a semiconductor structure, and associated method of making, of CMOS transistors having sub-0.1 micron channel lengths and adequately abrupt junction profiles.

BACKGROUND OF THE INVENTION

Conventional transistor formation processes utilizing ion-implantation to form the channel and source/drain structures do not provide the desired abrupt profiles required to support the formation of CMOS transistors with sub-0.1 micron channel lengths.

One available fabrication method and structure is the conventional ion-implanted channel formation, which acts to control Vt (threshold voltage). The problem with this process and the resulting structure is that the profiles are too deep and not sufficiently abrupt. Controlling the dimensions, and thus the performance characteristics, of the very thin layers is not practical with ion-implantation and subsequent implant anneal steps.

The delta-doped channel also provides insufficient profiles for transistors having sub-0.1 micron channel lengths. In this process, and resulting structure, an undoped epitaxial layer is formed on top of the substrate as the channel region. The problem with this process is that Vt control is essentially governed by the thickness of the undoped layer. For sub-0.1 micron channel lengths, the substrate dopants will diffuse, resulting in undesirably high Vt, unless the layer of epitaxial silicon is thick. If the epitaxial silicon layer is thick, then detrimental short-channel effects will be excessive.

What is needed is a structure, and associated method of making, that provides adequate profiles for transistors having sub-0.1 micron channel lengths.

It is with the foregoing problems in mind that the instant invention was developed.

SUMMARY OF THE INVENTION

The present invention concerns the formation of CMOS transistors, and specifically CMOS transistors having sub-0.1 micron channel lengths, and associated methods for making. The solution to the problems set forth above resides fundamentally in the use of doped epitaxial silicon layers prior to the source/drain formation in a disposable gate CMOS transistor fabrication process. These layers provide desirable Vt control.

The invention discloses structures and methods for disposable-gate CMOS transistors intended for sub-0.1 micron gate length applications. At these short lengths, abrupt source/drain and channel profiles are needed for good transistor performances. For low Vcc, which implies low Vt, and for mid-gap work function gate (TiN), a surface counter-doped channel ("buried layer") buried channel design is desired. In the present invention, counter-doped epitaxial silicon (doped opposite to the substrate type) is used to form the counter-doped surface layer while maintaining an abrupt channel profile. Shallow source/drain junctions with abrupt source/drain profiles may be formed using raised (or elevated) source/drain design. One problem is connecting the channel to the abrupt source/drain region. In the present invention, three structures and associated methods are disclosed to connect the channel to the abrupt source/drain regions. These three structures starting with a counter-doped epitaxial silicon layer are: 1) drive-in from the source/drain; 2) a groove, defined by a localized oxidation removed by deglaze, in the counter-doped epitaxial layer in the channel; and 3) undercut the pad oxide to expose the source/drain, which subsequently is the overlap region. Techniques (2) and (3) have the additional advantage of resulting in better short-channel transistor characteristics.

In light of the above, therefore, the invention encompasses a transistor structure including a doped silicon substrate, and an oppositely-doped epitaxial silicon layer formed on the substrate. A gate is formed on the epitaxial layer, the gate defining a channel region in the epitaxial layer underneath the gate. A doped layer is formed on the epitaxial silicon layer on opposing sides of, and is isolated from, the gate. The layer, with underlying portions of the epitaxial layer and silicon substrate, forms a source region and a drain region on opposing sides of the gate, with portions of the source region and the drain region in contact with the channel region on opposing sides of the gate. A portion of the gate overlaps a portion of the source region and a portion of the drain region.

In addition, the instant invention encompasses a transistor structure including a doped silicon substrate, an oppositely-doped epitaxial silicon layer formed on the substrate, the epitaxial layer defining a groove therein. A gate is formed over the groove on the epitaxial layer and defines a channel region in the epitaxial layer underneath the gate, with the channel region encompassing the groove. A doped layer is formed on the epitaxial silicon layer on opposing sides of, and is isolated from, the gate. The layer forms a source region and a drain region, each on opposing sides of the gate. Portions of the source region and the drain region are in contact with the channel region on opposing sides of the gate. A first portion of the gate overlaps a portion of the source region and a second portion of the gate overlaps a portion of the drain region.

Further, the instant invention encompasses a transistor structure including a doped silicon substrate, an oppositely-doped epitaxial silicon layer formed on the substrate, and a gate overlying the epitaxial layer and defining a channel region in the epitaxial layer underneath the gate. A doped layer is formed on the epitaxial silicon layer on opposing sides of, and is isolated from, the gate. The layer forms a source region and a drain region, each on opposing sides of the gate. Portions of the source region and the drain region are in contact with the channel region on opposing sides of the gate. A pad oxide layer is formed on the epitaxial layer between the epitaxial layer and the gate layer. The pad oxide layer is also formed on a portion of the source region and the drain region. A first portion of the gate is separated from the source region by the pad oxide layer, and second portion of the gate is separated from the drain region by the pad oxide layer. The first portion of the gate overlaps a portion of the source region, and the second portion of gate overlaps a portion of the drain region.

Further, the instant invention encompasses a gate structure including a doped silicon substrate, an oppositely-doped epitaxial silicon layer formed on the substrate, and a gate formed on the epitaxial layer which defines a channel region in the epitaxial layer underneath the gate. A source region is formed in the epitaxial layer and the doped silicon substrate on one side of the gate. A drain region is formed in the epitaxial layer and the doped silicon substrate on an opposite side of the gate from the source region. A portion of the source region and a portion of the drain region are each in contact with the channel region on opposing sides of the gate. A first portion of the gate overlaps a portion of the source region, and a second portion of the gate overlaps a portion of the drain region.

It is a primary object of the present invention to provide a transistor structure having a counter-doped epitaxial silicon layer as the channel, to allow the formation of abrupt channel profiles.

It is an additional object of the present invention to provide a transistor structure having a counter-doped epitaxial silicon layer as the channel and having an elevated source/drain layer, which allow the formation of abrupt channel profiles.

These and other objects, features, and advantages of the invention will become apparent to those skilled in the art from the following detailed description, when read in conjunction with the accompanying drawings and appended claims.

BRIEF DESCRIPTION OF THE DRAWINGS

FIG. 5(a)–(c) are representational sections of the formation of a partial transistor as shown in FIG. 4 using a disposable nitride gate material.

FIG. 6(a)–(d) are representational sections of the formation of a partial transistor similar to that shown in FIG. 4 using a disposable polysilicon gate material.

DETAILED DESCRIPTION OF THE PREFERRED EMBODIMENT

Figure 1:
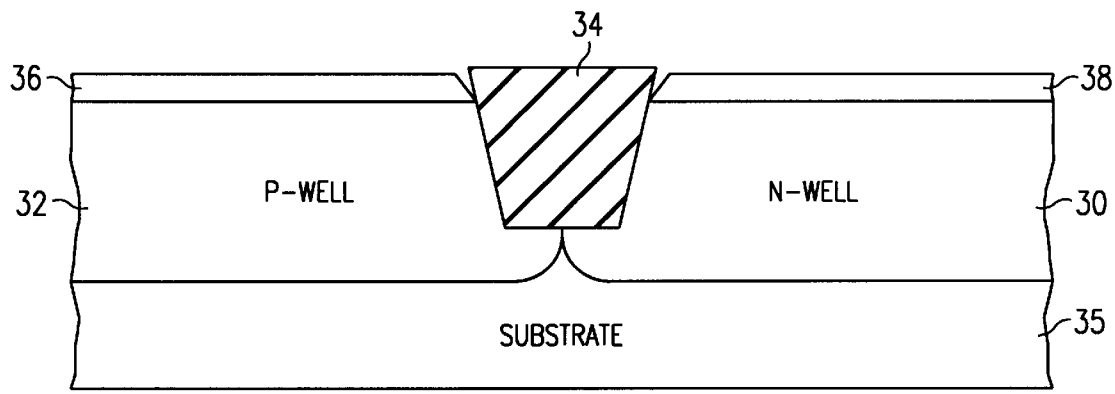
FIG. 1 is a representative section of a silicon substrate structure including a dual doped epitaxial silicon layer (an n-doped epitaxial silicon layer and a p-doped epitaxial silicon layer) according to the present invention.

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention. It will be apparent to those skilled in the art that the invention is also applicable to various integrated circuit processes, structures, and devices.

The instant invention includes dual-doped epitaxial layers which are of the opposite conductivity type as the substrate (n-type for NMOS and p-type for PMOS) which serve as counter-doped layers for allowing consistent and controllable Vt adjustment. The use of dual-doped epitaxial layers in the formation of the gate structure of the present invention allows the formation of adequate source/drain profiles in devices having sub-0.1 micron gate lengths. Dual-doped epitaxial layer means that there is one doped epitaxial layer for nMOS transistor and a different doped epitaxial layer for pMOS transistors. The counter-doped layers also helps in providing a connection to the source/drain regions. FIGS. 1 through 11(d) show the major steps, and some alternatives, included in forming the final structure incorporating the present invention. The use of the counter-doped epitaxial layers, as described below with respect to disposable gate processes, can also be used on non-disposable gate processes. Several structures for connecting to the source/drain regions are also disclosed.

First a general description of the major steps is provided, with a more detailed description following. The initial step is to form the n-epitaxial layer and p-epitaxial layers on the respective substrates, with the epitaxial layers separated by isolation regions formed by oxide. See FIGS. 1–3. Next, disposable gate and source/drain regions are formed on the dual-doped epitaxial layers. Either polysilicon or silicon nitride ($Si_3N_4$) disposable gates can be used, with the attendant variations in processing dependent on the disposable gate material. See FIGS. 4–6. Next, the disposable gate is removed. See FIG. 7. Then, the connection to the source/drain regions is prepared prior to the formation of the final gate material. See FIGS. 8–11. The resulting transistor structure has the desired abrupt profiles required for sub-0.1 micron gate lengths, provides desired performance characteristics, and is able to be fabricated using known or available processing technologies.

The invention is described using disposable gates in the formation of the transistor structure. Disposable gates provide advantages in processing, such as not subjecting the permanent gate to harmful processing parameters. However, the invention described herein can also be practiced on transistor fabrication processes not using disposable gates.

The formation of the dual-doped epitaxial layers is shown in FIGS. 1–3. FIG. 1 shows the structure after the dual-doped epitaxial layers are formed. An n-well region 30 is separated from a p-well region by a known or available isolation structure 34, such as the oxide trench-isolation structure shown. The n-well and p-well regions are formed in a Si substrate 35 by any known or available process. A layer of n-epitaxial silicon 36 is formed on the p-well region 32, and a layer of p-epitaxial silicon 38 is formed on the n-well region 30.

Figure 2A:
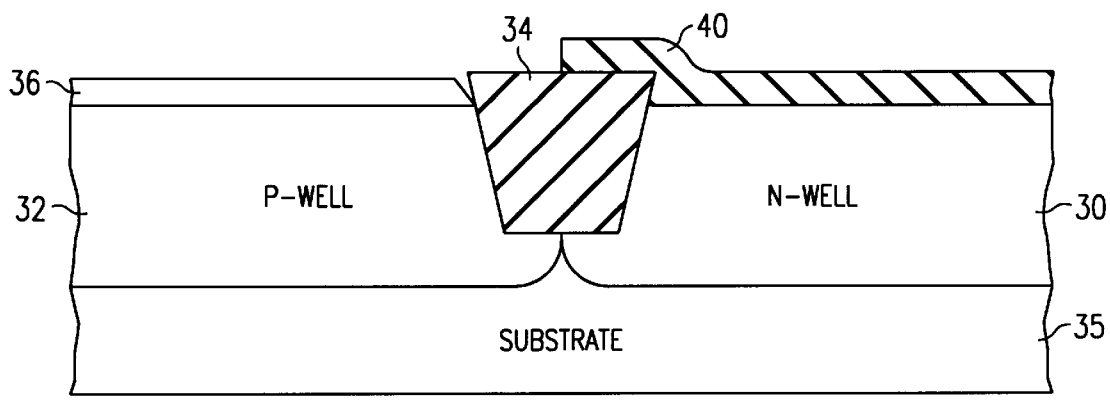
FIG. 2(a)–(b) are representative sections of one method of forming the dual doped epitaxial silicon layer on the substrate.

The formation of the dual-doped epitaxial layers 36 and 38 can be accomplished by various methods. Two such methods are set forth herein. A first method is shown in FIGS. 2(a) and (b). This method is also disclosed in Texas Instruments Case No. TI-23226, U.S. patent application Ser. No. 09/537,271, filed Mar. 29, 2000, assigned to the assignee of the instant application, and hereby incorporated by reference. In forming the dual-doped epitaxial layers 36 and 38 pursuant to the first method, after the n-well 30 and p-well 32 regions are formed, one of the two regions is covered by a cap oxide 40, such as LPCVD-TEOS oxide approximately 150 Å thick, which extends over a portion of the isolation oxide 34. As shown in FIG. 2(a), the n-well region 30 is covered by the cap oxide 40 to allow formation of the n-doped epitaxial layer 36 over the p-well region 32. The cap oxide 40 is formed by known or available deposition methods, such as CVD or plasma enhanced CVD processes.

The n-doped epitaxial silicon layer 36 does not form on the isolation oxide 34, or on the cap oxide 40. The n-doped epitaxial silicon layer 36 is formed by selective epitaxial growth, and is in-situ doped by known dopants such as phosphorous or arsenic (for n-type) during formation. The n-doped epitaxial silicon layer 36 is formed to a thickness of approximately 300 Å. Next, the cap oxide 40 is removed from the surface of the n-well region 30 by wet chemical etch using HF. The cap oxide 42 is then formed on the n-doped epitaxial layer 36 overlying the p-well region 32. The cap oxide 42 extends over at least a portion of the isolation oxide 34.

Figure 2B:
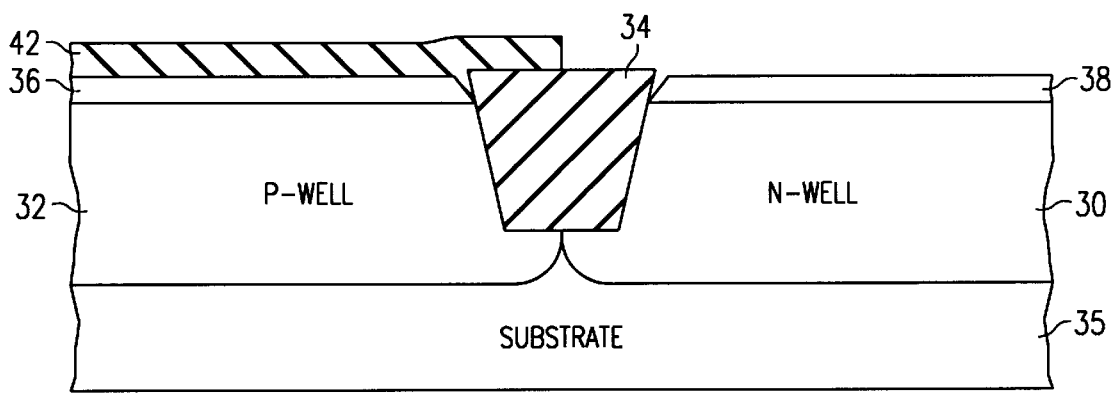

The p-doped epitaxial layer 38 is then formed on the n-well region 30 to a thickness of approximately 300 Å, as shown in FIG. 2(b). The p-doped epitaxial silicon layer is formed by selective epitaxial growth, and is in-situ doped during formation with boron (for p-type). The cap oxide 42 is then removed from the n-doped epitaxial layer 36 without affecting the other exposed structures to form the structure as substantially shown in FIG. 1. The cap oxide can be removed by wet chemical etch using HF.

Another method of forming the dual-doped epitaxial layers is shown in FIGS. 3(a)–(d). In this method, generally the n-doped epitaxial silicon layer 36 is formed on both p-well 32 and n-well 30 regions, and then removed from the n-well regions 30 to allow the formation of the p-doped epitaxial layer 38 over the n-well region 30.

Figure 3A:
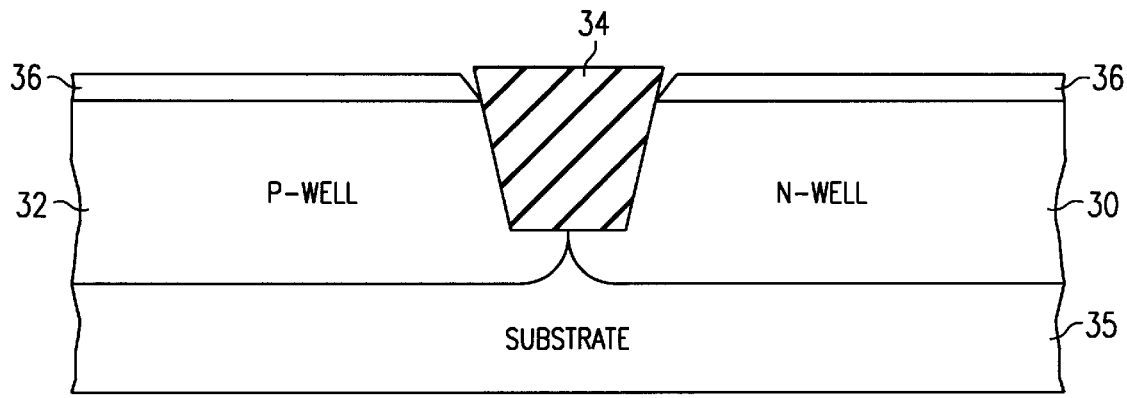
FIG. 3(a)–(e) are representational sections of another method of forming the dual doped epitaxial silicon layer on the substrate.
Figure 3B:
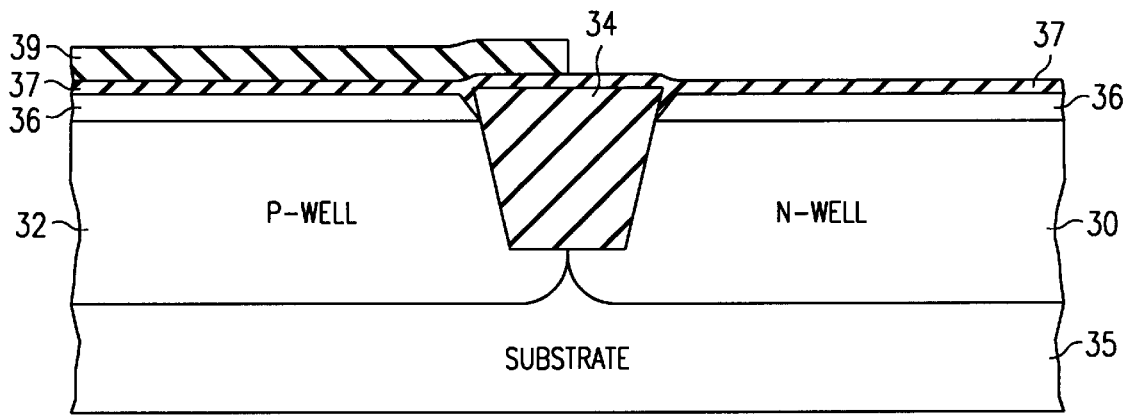
Figure 3C:
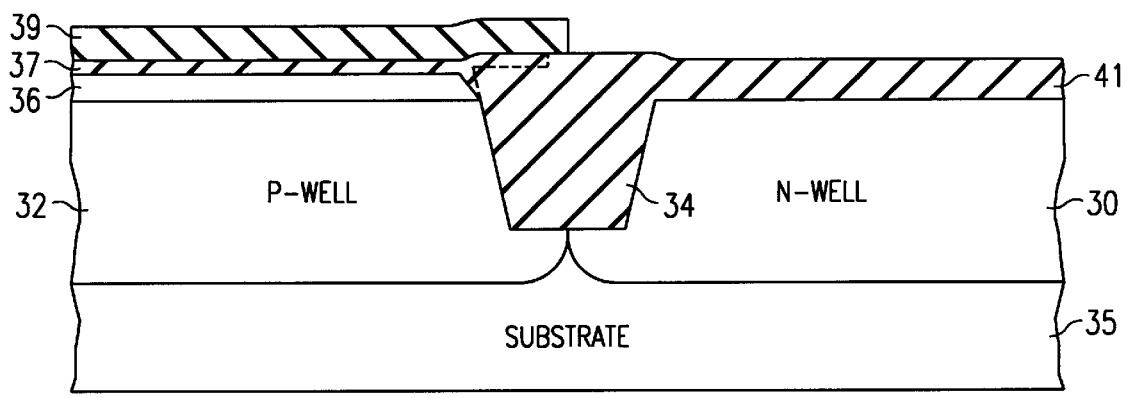
Figure 3D:
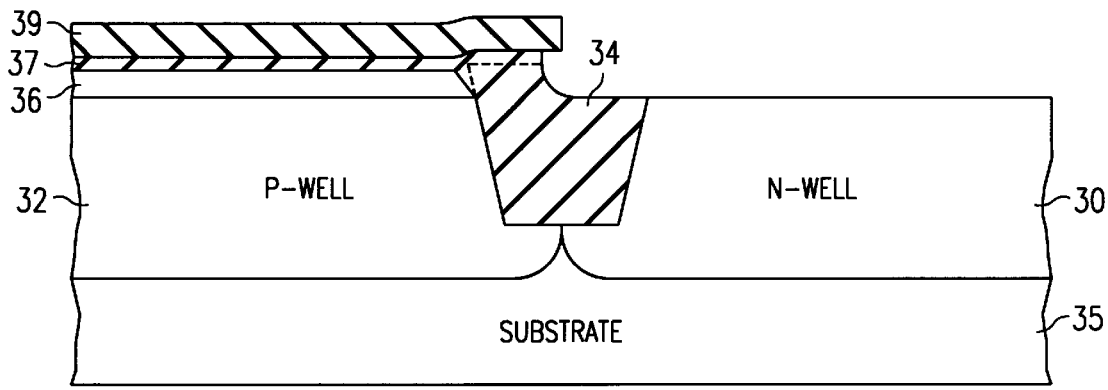
Figure 3E:
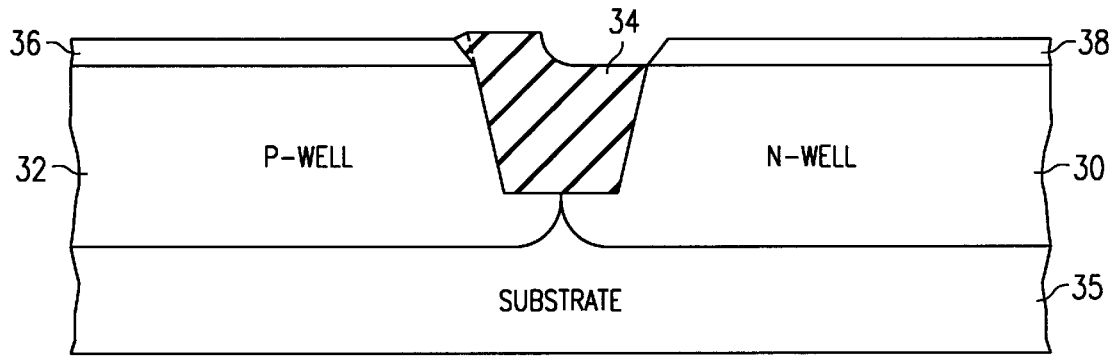

An n-doped epitaxial layer 36 is first formed over both the n-well 30 and p-well regions 32, as shown in FIG. 3(a). The n-doped epitaxial silicon layer 36 is formed by selective epitaxial growth, and is in-situ doped with known dopants such as phosphorous or arsenic (for n-type) during formation. The n-doped epitaxial silicon layer 36 is formed to a thickness of approximately 300 Å. Next, a thin layer of oxide 37 is deposited over all surfaces to a thickness of approximately 150 Å. A layer 39 of $Si_3N_4$ is then deposited to a thickness of approximately 1500 Å. The layer 39 is then patterned and etched, as shown in FIG. 3(b), which removes the nitride. The n-doped epitaxial silicon 36 is then oxidized entirely to consume the n-doped layer 36 over the n-well 30 down to the top surface of the n-well 30, as shown in FIG. 3(c). The oxide layer 41 is then removed by etching, such as with HF, to remove the formed oxide layer 41 down to the underlying n-well region 30. No n-doped epitaxial layer 36 thus remains on the N-well region 30. See FIG. 3(d). A layer 38 of p-doped epitaxial silicon is then grown on the n-well region 30. A layer of oxide is then formed to a thickness of approximately 100 Å (not shown). The nitride is the etched off of the layer 36, such as by using $H_3PO_4$, to the top surface of the oxide layer overlying the doped epitaxial silicon layers 36 and 38. The oxide layer is then removed from the top surfaces of the doped epitaxial silicon layers 36 and 38, as shown in FIG. 3(e).

The dual-doped epitaxial layers 36 and 38 are formed after the formation of the isolation structure 34, in the instant case trench isolation structure, because typically the formation of the isolation structure requires high-temperature steps which can cause undesirable diffusion of the dopants from the n- and p-doped epitaxial layers 36 and 38.

Figure 4:
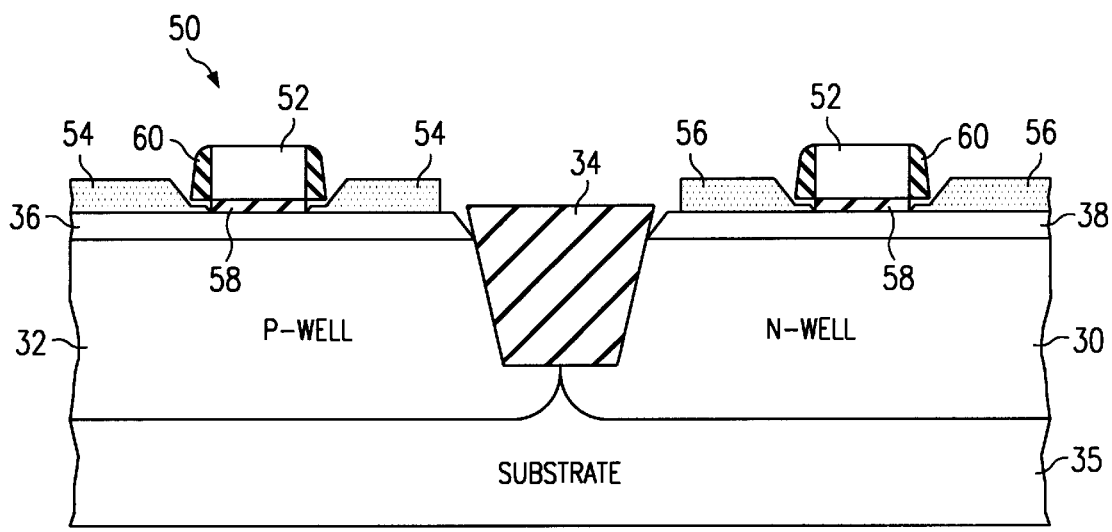
FIG. 4 is a representational section of a partial transistor made pursuant to the present invention.

Next, the disposable gate structure 50 of FIG. 4 is fabricated. The disposable gate 52 of FIG. 4 can be either nitride or polysilicon. The formation of the nitride gate is shown in FIGS. 5(a)–(c), and the formation of the polysilicon gate is shown in FIGS. 6(a)–(d). As shown in FIG. 4, raised source/drain layers 54, 56 are formed on the doped epitaxial silicon layers 36 and 38. A raised n+ source/drain layer 54, approximately 300 Å thick, is formed on the n-doped epitaxial silicon layer 36, which is formed over the p-well region 32. The n+ source/drain layer 54 is formed by selective epitaxial growth of undoped silicon. The undoped silicon layer is then doped appropriately by patterning and ion-implantation, as is known or available in the art.

A raised p+ source/drain layer 56, approximately 300 Å thick, is formed on the p-doped epitaxial silicon layer 38, which is formed over the n-well region 30. The p+ source/drain layer 56 is formed by selective epitaxial growth of undoped silicon. The undoped silicon layer is then doped appropriately by patterning and ion-implantation, as is known or available in the art.

The polysilicon or nitride gate 52 is formed on a layer of pad oxide 58, approximately 50 Å thick. With respect to the polysilicon disposable gate 52, oxide or nitride sidewalls 60 are formed to isolate the gate 52 from the surrounding materials. Preferably, nitride sidewalls 60 are used so that the oxide insulating adjacent gates will be protected from the pre-gate deglaze process. The pre-gate deglaze process is an oxide etch with HF to expose the underlying Si surface prior to gate oxide growth. With respect to the nitride disposable gate, oxide sidewalls are formed.

The formation of the gate structure 50, including the formation of the raised source/drain layers 54 and 56, can be performed with any known or available process. The preferred method of forming the silicon nitride ($Si_3N_4$, hereinafter "nitride") disposable gate structure is shown in FIGS. 5(a)–(c). The formation of the gate structure is shown only with respect to the gate structure over the p-well region 32, as the gate structure formation over the n-well region 30 is substantially similar and does not need to be separate explained. The pad oxide layer 58 and nitride layer 62 are formed on the epitaxial silicon 36. The pad oxide 58 is approximately 50 Å thick, and the disposable gate material 62 is approximately 2000 Å thick. The two 58 and 62 layers are then patterned and plasma-etched (preferably anisotropically) to stop on the top surface of the n-epitaxial layer 36. This step forms the gate stack structure 64 of pad oxide 58 overlying the epitaxial silicon 36, and nitride gate material layer 62 overlying the pad oxide 58. Oxide sidewall spacer structures 66, such as $SiO_2$, are then formed, such as by depositing a blanket of the sidewall material layer (oxide) and performing a plasma blanket etch-back, preferably anisotropic. The etch-back step stops on the n-doped epitaxial layer 36. The planar field etch-back forms the sidewall spacers 66 on the disposable nitride gate structure 64, see FIG. 5(b). The oxide sidewall spacers 66 are needed to space the raised source/drain layer 68, otherwise hot phosphoric etchants used in subsequent steps will etch the raised source/drain layer 68. The n+ raised source/drain regions 68 are then formed as described above with respect to layer 54, see FIG. 5(c).

The formation of the polysilicon disposable gate structure is set forth in FIGS. 6(a)–(d). The formation of the gate structure is shown only with respect to the gate structure over the p-well region, as the gate structure formation over the n-well region is substantially similar and does not need to be separately explained. The pad oxide layer 70 and disposable gate material layer 72 (polysilicon) are formed on the n-doped epitaxial silicon 36. The pad oxide 70 is approximately 50 Å thick, and the disposable gate material 72 is approximately 2000 Å thick. The polysilicon layer 72 is then patterned and plasma-etched (preferably anisotropically) to stop on the top surface of the pad oxide layer 70, see FIG. 6(a). Oxide or nitride sidewall spacer structures 74 are then formed, as shown in FIG. 6(b). Preferably nitride spacers 74 are formed, such as by depositing a blanket of the sidewall spacer material layer and performing a plasma blanket etch-back, preferably anisotropic. The etch-back step stops on the pad oxide 70 layer. The planar field etch-back forms the sidewall spacers 74 on the disposable polysilicon gate sidewalls. A known or available oxide de-glaze process is then performed to remove the pad oxide off of the n-doped epitaxial silicon layer 36, and under the spacers 74, but not substantially under the polysilicon gate material 72. Notches 76 are thus formed under the sidewall spacers 74. See FIG. 6(c). The oxide de-glaze process does not etch the n-doped epitaxial silicon layer 36. The deglaze process is a timed etch reliant on knowing the etch rate of the oxide during the process. Thus, the depth of the notches formed is thus adjustable as desired. The n+ raised source/drain layer 78 (would be p+ if on n-well region), is then formed as described above with respect to layer 54, see FIG. 6(d). A layer 73 of Si, approximately 300 Å thick, is formed on the top surface of the polysilicon 72 during the source/drain formation. The layer is a byproduct of the source/drain formation, does not impact the instant process, and is not removed. A toe 80 of the n+ raised source/drain layer may extend into the notch 76 formed under the spacer 74 by the de-glaze process. The toe 80 will probably touch the sidewall 74.

Figure 7A:
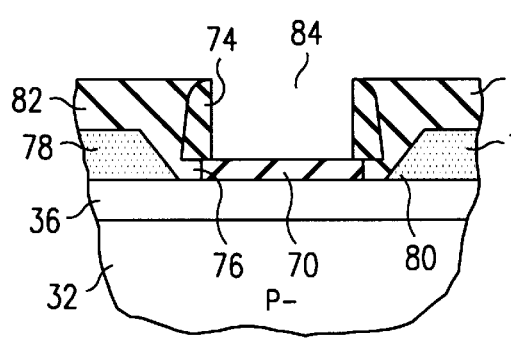
FIG. 7(a)–(b) are representational sections of the removal of the nitride or polysilicon disposable gate material.
Figure 7B:
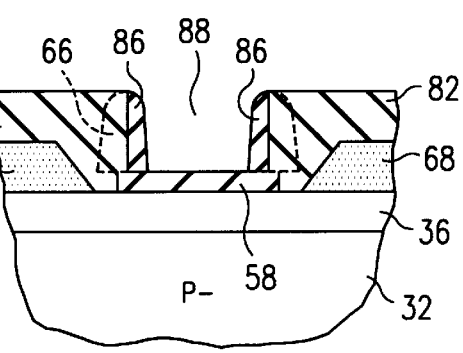

Next, the gate and source/drain structure 50 of FIG. 4, and as formed by the process described above in FIGS. 5 and 6, is planarized, as shown in FIG. 7(a). First, an oxide layer 82, such as LPCVD-TEOS is deposited to fill in any voids (such as the notches 76 under the sidewall spacers 74, and the spaces between the sidewall spacers and the raised source/drain layers 78). Typically, the oxide layer 82 is deposited to a thickness of approximately 2000 Å. The profile is then planarized, such as by a known or available chemical-mechanical polishing step, to stop on the top surface of the disposable gate material layer 72 (not shown). The disposable gate layer 72 is then removed by a known or available wet etch or a plasma etch. A trench 84 is formed by the removal of the gate material. One example of the process for the removal of a polysilicon disposable gate material layer 72 is to use an etch process including choline (trimethyl ammonium hydroxide+$(CH_3)_3NCH_2CH_2OH \cdot OH^-$.

Where the disposable gate 72 is polysilicon, the structure resulting after planarization and removal of the disposable gate is shown in FIG. 7(a). The sidewall spacers 74 remain and are exposed, as is the pad oxide 70 which was under the polysilicon gate material layer 72. The pad oxide forms the bottom wall of the trench 84, and the sidewall spacers 74 form the sidewalls of the trench 84.

Where the disposable gate is nitride, such as 62 in FIG. 5, the structure resulting after the planarization and removal of the disposable gate 62 is shown in FIG. 7(b). Nitride sidewall spacers 86 are formed on the sidewalls of the trench 88 defined by the removal of the nitride gate material layer 62. The nitride sidewall spacers 86 are required because the sidewalls of the trench 88 are oxide, and would be exposed to the subsequent pad oxide de-glaze process. The nitride sidewall spacers 86 are formed by any known or available process, such as by conformal deposition of a nitride layer and an anisotropic etch-back.

The structure and associated processes used in the connection of the permanent gate material to the n+ source/drain regions 78 is now explained with respect to the polysilicon disposable gate structure over the p-well as described above, and last shown in FIG. 7(a). This material is shown in FIGS. 8–11(d). The structure and associated processes used in the connection of the permanent gate material to the p+ source/drain regions, or for the nitride disposable gate structure, is substantially similar and therefore is not separately described.

Figure 8A:
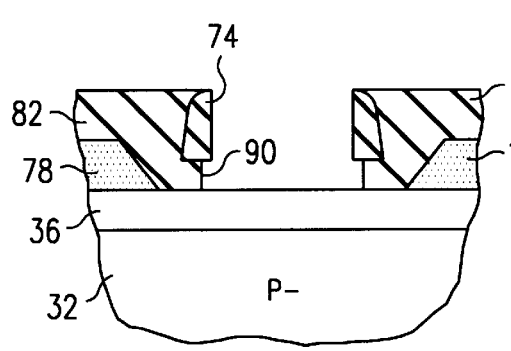
FIG. 8(a)–(c) are representational sections of one structure and method to form the permanent gate structure after the disposable polysilicon gate is removed.
Figure 8B:
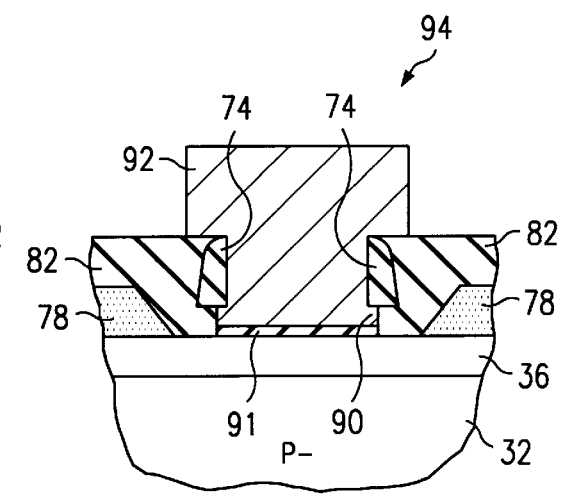
Figure 8C:
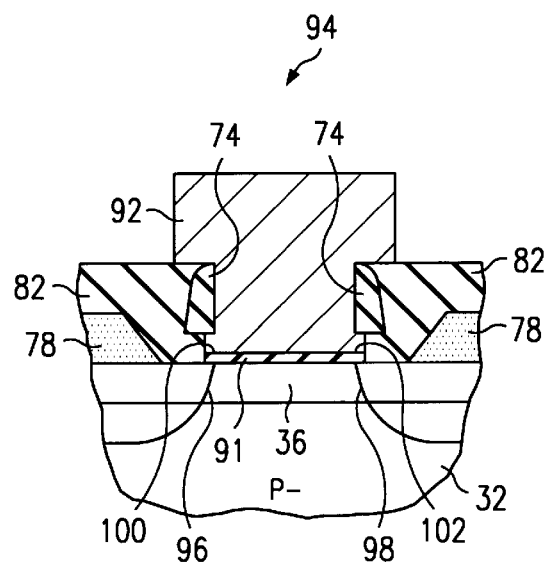

A first method and associated structure for forming the gate oxide and the replacement gate or permanent gate is shown in FIGS. 8(a)–(c). FIG. 8(a) shows the structure of FIG. 7(a) after a pad oxide de-glaze process, where the pad oxide 70 was entirely removed. The inner edges of the sidewall spacers are undercut somewhat in the de-glaze process to form a laterally extending notch 90. The pad oxide de-glaze step is performed as surface preparation prior to gate oxide growth.

After the pad oxide de-glaze step, the gate oxide 91 is grown, and the permanent gate material 92 is deposited, patterned, and etched in a known or available manner to leave plugs filling the trench 84 defined by the removal of the disposable polysilicon gate layer material 72. See FIG. 8(b). The permanent gate material 92 may be polysilicon, metal or a stack of multiple materials, such as TiN/W, or polysilicon/TiN/W. The permanent gate material is initially formed in a layer with a thickness of approximately 1000–2000 Å. The permanent gate material 92 is then patterned with photoresist and etched in a plasma, preferably anisotropic, to form the permanent gate structure. The permanent gate 92 material fully fills the trench 84, and contacts the sidewall spacers 74, pad oxide 70, and fills the lateral notches 90 formed under the inner edge of the spacers. By filling the lateral notches 90, the gate material extends part of the way under the spacer 74 and is thus closer to the n+ source/drain layer. Known or available Damascene processes may also be used to form a permanent gate structure. The line width of the bottom of the gate at this stage is roughly the same dimension or larger than the slot, and includes notches 90, which dimension may be sub-0.1 micron to several microns.

After the permanent gate structure 94 is formed in the trench, performing a drive-in step forms the required transistor junctions 96 and 98. An acceptable drive-in step includes an anneal performed at 1000C for 25 seconds in an $N_2$ ambient atmosphere. The elevated source/drain layers 78 provide the dopant for diffusion into the n-doped epitaxial layer 36 and the p-well 32. The junction 96 between the source region on the left of FIG. 8(c) extends to a location under the pad oxide 70, and under the gate 92, and forms an overlap 100 between the source region 96 and the gate 92. Similarly, the diffusion profile 98 of the drain junctions on the right of FIG. 8(c) extends to a point under the pad oxide 70, and under the gate 92, and forms an overlap 102 between the gate 92 and the drain. The junctions 96, 98 formed by the drive-in step are not severely abrupt. The n-doped epitaxial silicon 36 is designed to improve Vt adjust characteristics, and helps reduce the source/drain resistance, thus minimizing the extent of drive-in required to obtain desired performance characteristics.

Figure 9A:
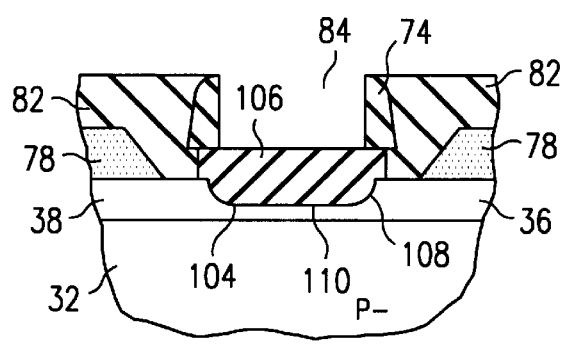
FIG. 9(a)–(b) are representational sections of a second structure and method to form the permanent gate structure after the disposable polysilicon gate is removed.

A second structure and associated process for connecting the permanent gate material to the n+ source/drain regions is shown in FIGS. 9(a) and (b). Basically, a groove 104 is formed at the bottom of the trench 84 to allow lateral connection of the gate to the source/drain through a combination horizontal and vertical interface. Again starting with FIG. 7(a), the pad oxide 70 is removed at the bottom of the trench 84 using a known or available wet or dry etch process. Sacrificial oxide 106 is grown in the bottom of the trench 84 and consumes some of the n-doped epitaxial silicon 36. See FIG. 9(a). The process for growing the sacrificial oxide 106 includes thermal oxidation at approximately 850C in a dry O₂ ambient atmosphere.

Figure 9B:
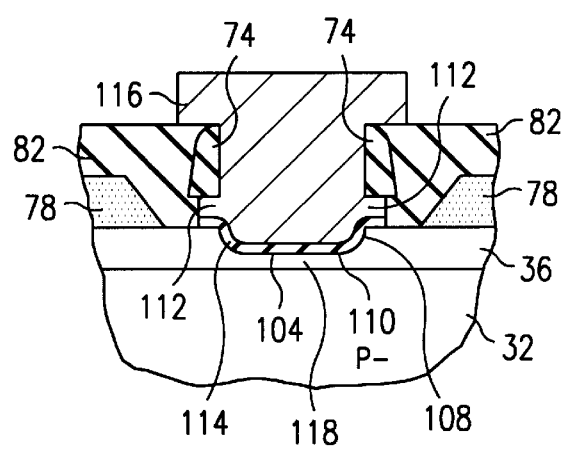

As shown in FIG. 9(b), the sacrificial oxide 106 is removed using a known or available wet or dry etch process, such as an oxide de-glaze process. The removal of the sacrificial oxide 106 forms a groove 104 in the bottom of the trench 84 (in the n-doped epitaxial layer 36), which has substantially vertically oriented sidewalls 108 and a substantially horizontally oriented bottom surface 110. The removal of the sacrificial oxide also forms notches 112 that extend laterally under the spacers 74. The sidewalls 108 can extend under the sidewall spacer structure 74 or beyond, depending on the size of the groove 104 formed by the removal of the sacrificial oxide 106. A gate oxide layer 114 is grown in the groove 104 to a thickness of approximately 20 to 200 Å.

After the gate oxide 114 is grown, the trench 84 and groove 104 are filled with permanent gate material 116, such as the material noted above with respect to FIG. 8. The gate material 116 overlies the gate oxide 114 and covers the vertically oriented sidewalls 108 of the groove 104 and completely fills the notches 112. The permanent gate material 116 is then patterned and etched, as described above with respect to FIGS. 8(a)–(c). Alternatively, a damascene planarization process could be used to leave a similarly filled slot without the top T-gate structure shown herein. The permanent gate 116 interfaces with the n-doped epitaxial silicon layer 36 through a substantially vertical interface 108 (through the gate oxide 114 and through the sidewalls 108 of the groove 104), and from the n-doped epitaxial silicon layer 36 to the opposing elevated n+ source/drain regions 78. No drive-in is required. By connecting to the opposing elevated n+ source/drain layers 78 through the substantially vertical sidewalls 108 of the groove 104, effectively a zero-junction depth design is obtained, hence improving short-channel effects, such as the reduction in threshold voltage with decreasing gate length, the reduction of output resistance with decreasing gate length, and degradation of subthreshold swing -with decreasing gate length.

The n-epitaxial silicon 36 remaining after the partial removal (by oxidation and oxide etch) is designed for Vt adjust. The groove 104 serves to provide the overlap between the channel 118 and the opposing source/drain regions 78. Thus, the total number of n-type dopant per unit area in the n-epitaxial silicon 36 is higher than that for the method described with respect to FIGS. 8(a)–(c) above. This method uses the n-doped epitaxial silicon 36 as the source/drain extension, and thus maintains the desired abrupt profiles. The extra oxidation step used in forming the groove 104 may cause additional diffusion of the dopant from the n+ source/drain layer 36.

Figure 10A:
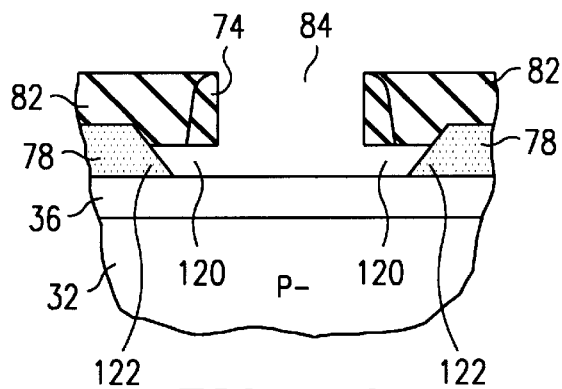
FIGS. 10(a)–(b) are representational sections of a third structure and method to form the permanent gate structure after the disposable polysilicon gate is removed.

A third structure and associated process for connecting the permanent gate material to the n+ source/drain regions is shown in FIGS. 10(a) and (b). Again, starting with FIG. 7(a), a de-glaze step is performed to remove the pad oxide 70 and some of the filler oxide 82 to expose the top surface of the n-doped epitaxial layer 36 at the bottom of the trench 84 form a notch 120 underneath the sidewall spacers 74, and laterally outwardly to expose a portion 122 of each of the opposing elevated n+ source/drain layers 78, as shown in FIG. 10(a).

Figure 10B:
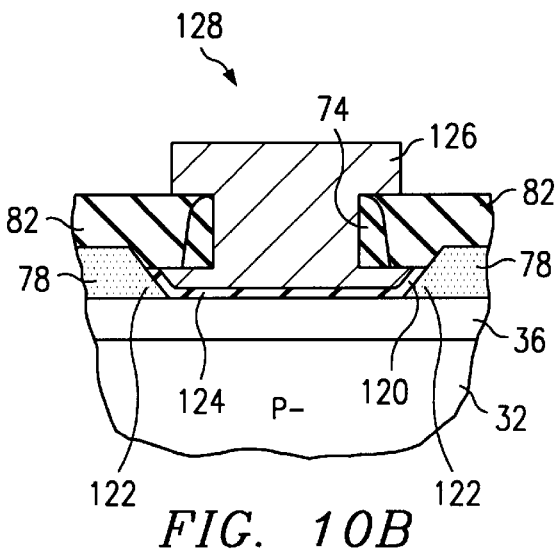

A gate oxide layer 124 is formed on the top surface of the exposed n-doped epitaxial silicon layer 36, and on the sloped sidewalls exposed portions 122 of the opposing elevated source/drain layers 78. The gate oxide 124 is approximately 20–100 Å thick, and acts to isolate the subsequently deposited gate material 126 from the opposing source/drain layers 78. Permanent gate material 126 is then deposited into the trench 84. The permanent gate material 126 completely fills the trench 84, including the notches 120 formed under the sidewall spacers 74. The permanent gate material 126 is then patterned and etched, as discussed above, to produce the gate formation 128 as shown in FIG. 10(b). The permanent gate material 126 contacts the gate oxide 124 grown on the sloped, substantially vertical portions 122 of the opposing elevated source/drain layer 78. Thus, this structure constitutes the overlap between the gate 126 and drain. This technique does not require the n-doped epitaxial silicon layer 36, but the n-doped epitaxial silicon layer 36 helps reduce source/drain resistance. The short channel effects, as denoted above, are improved also improved by this method and structure.

Figure 11A:
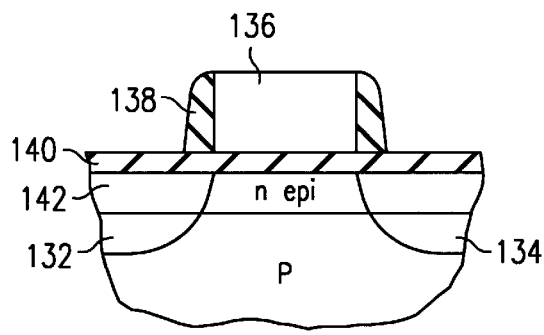
FIGS. 11(a)–(d) are representational sections of a structure and method to form the permanent gate structure where raised source/drain layers are not utilized in the formation of the transistor.

The previous examples have been provided using the example with an elevated source/drain layer 78, however an elevated source/drain layer 78 is not required. FIGS. 11(a)–(d) provide an example of the process for connecting the permanent gate material 160 to the n+ source/drain regions 132, 134 where the source/drain regions are not raised, and the process is similar to that described with respect to FIGS. 10(a) and (b). FIG. 11(a) shows a disposable polysilicon gate structure 136 formed with nitride sidewall spacer structures 138, all formed on a layer of pad oxide 140, which overlies a layer of n-doped epitaxial silicon 142, which in turn overlies a p-well 144. Source/drain regions 132, 134 are formed by an implant step, and form n+ regions. The junction of the opposing source/drain regions 132, 134 and the channel 146 are formed generally under the opposing sidewall spacers 138.

Figure 11B:
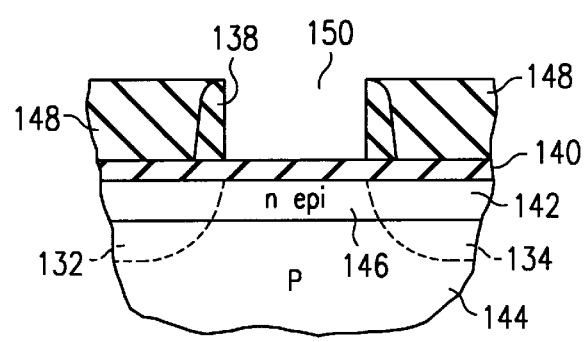
Figure 11C:
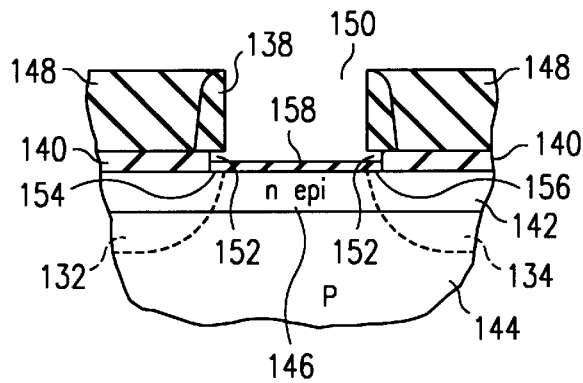

FIG. 11(b) shows the disposable polysilicon gate structure after a fill oxide 148 has been applied and planarization has been accomplished, such as by a chemical-mechanical polish step. The disposable polysilicon gate material 136 is then removed using a wet etch or a plasma etch. The removal of the disposable polysilicon material forms a trench 150. The sidewalls of the trench 150 are formed of the nitride sidewall spacers 138, and the bottom of the trench 150 is formed by the top surface of the pad oxide layer 140.

The pad oxide layer 140 is then removed in a de-glazing step down to the surface of the n-doped epitaxial silicon layer 142, and is also removed from under a portion of the sidewall spacers 138 to form notches 152 thereunder. The notches extend past the junction formed between the source 132 and channel 146 on one side of the trench 150, and the drain 134 and channel 146 on the other side of the trench 150. The junctions extend to the top surface of the n-doped epitaxial silicon layer 142. See FIG. 11(c). Portions 154, 156 of the n+ source region 132 and the n+ drain region 134 are then exposed. A layer of gate oxide 158, approximately 20–100 Å thick, is then formed on the exposed n-doped epitaxial polysilicon 142.

Figure 11D:
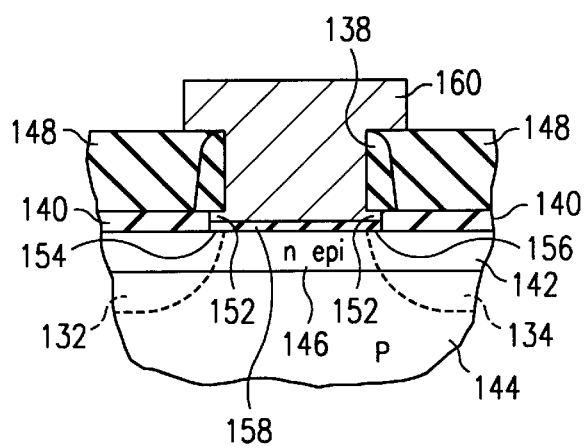

As shown in FIG. 11(d), the permanent gate material 160, such as the material provided above for previously-described permanent gates, is deposited to fill the trench 150, including the notches 152. The permanent gate material 160 extends over the exposed opposing source 154 and drain 156 portions, with the gate oxide 158 interposed therebetween. The length of n-doped epitaxial silicon layer 142 that is exposed on either end of the channel 146 past the respective junction during the de-glaze step is the amount of overlap 154 afforded between the gate material 160 and the source region 132, and the overlap 156 afforded between the gate material 160 and the drain region 134, respectively. The benefits of this design are that the process is low-cost and very effective.

The use of disposable (replacement) gates in the fabrication NMDS transistors is further discussed in "Sub-100 nm Gate Length Metal Gate NMOS Transistors Fabricated by a Replacement Gate Process," IEDM 97-821,0-7803-4100-7/97© IEEE, which is incorporated by reference herein and attached as Appendix "A" as part of the instant disclosure.

While this invention has been described with reference to the illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A replacement gate MOSFET, comprising:
    a doped silicon substrate;
    an oppositely doped epitaxial silicon layer formed on the doped silicon substrate;
    a gate oxide layer with a top surface and a bottom surface wherein said bottom surface of said gate oxide layer contacts said oppositely doped epitaxial silicon layer;
    a permanent gate on said gate oxide layer with a bottom surface, side surfaces, and a top surface wherein said bottom surface of said permanent gate contacts said top surface of said oxide layer;
    sidewall spacers formed on the side surfaces of said permanent gate; and
    lateral notches adjacent to either side of the bottom surface of said permanent gate, said lateral notches having bottom surfaces, side surfaces and top surfaces wherein said bottom surfaces of said lateral notches are formed by the gate oxide layer and said top surfaces of said lateral notches are formed by the sidewall spacers.

2. The replacement gate transistor of claim 1, further comprising:
    raised source/drain layers formed over said epitaxial silicon layer on either side of the permanent gate and adjacent to said lateral notches; and
    portions of said permanent gate extending into and filling said lateral notches.

3. The replacement gate transistor of claim 2 wherein said top surface of said permanent gate extends beyond the sidewall spacers.

4. A replacement gate MOSFET, comprising:
    a doped silicon substrate;
    an oppositely doped epitaxial silicon layer formed on the doped silicon substrate;
    a gate oxide layer with a top surface and a bottom surface wherein a portion said bottom surface of said gate oxide layer contacts said oppositely doped epitaxial silicon layer;
    a permanent gate on said gate oxide layer with a bottom surface, side surfaces, and a top surface wherein said bottom surface of said permanent gate contacts said top surface of said oxide layer;
    sidewall spacers formed on the side surfaces of said permanent gate; and
    lateral notches adjacent to either side of the bottom surface of said permanent gate, said lateral notches having bottom surfaces, side surfaces and top surfaces wherein said bottom surfaces and said side surfaces of said lateral notches are formed by the gate oxide layer and said top surfaces of said lateral notches are formed by the sidewall spacers.

5. The replacement gate transistor of claim 4, further comprising:
    raised source/drain layers formed over said epitaxial silicon layer on either side of the permanent gate and adjacent to said lateral notches; and
    portions of said permanent gate extending into and filling said lateral notches.

6. The replacement gate transistor of claim 5 wherein said top surface of said permanent gate extends beyond the sidewall spacers.

7. A replacement gate MOSFET, comprising:
    a doped silicon substrate;
    an oppositely doped epitaxial silicon layer formed on the doped silicon substrate;
    a gate oxide layer with a top surface and a bottom surface wherein said bottom surface of said gate oxide layer contacts said oppositely doped epitaxial silicon layer;
    a permanent gate on said gate oxide layer with a bottom surface, side surfaces, and a top surface wherein said bottom surface of said permanent gate contacts said top surface of said oxide layer;
    sidewall spacers formed on the side surfaces of said permanent gate;
    lateral notches adjacent to either side of the bottom surface of said permanent gate, said lateral notches having bottom surfaces, side surfaces and top surfaces wherein said bottom surfaces of said lateral notches are formed by the gate oxide layer and said top surfaces of said lateral notches are formed by the sidewall spacers;
    raised source/drain layers formed over said epitaxial silicon layer on either side of the permanent gate and adjacent to said lateral notches;
    a source region beneath said raised source/drain layers where a portion of said permanent gate overlaps a portion of said source region; and
    a drain region beneath said raised source/drain layers where a portion of said permanent gate overlaps a portion of said drain region.

8. The replacement gate transistor of claim 7 wherein portions of said permanent gate extends into and fills said lateral notches.

* * * * *